(12) United States Patent
Navas Sabater et al.

(10) Patent No.: US 6,504,734 B2
(45) Date of Patent: Jan. 7, 2003

(54) SWITCHED POWER CONVERTER UTILIZING A PIEZOELECTRIC TRANSFORMER

(75) Inventors: Jose Andres Navas Sabater, Madrid (ES); Mercedes Rivas Saiz, Madrid (ES); Juan Diez Gonzalez, Oviedo (ES); Juan Martin Ramos, Oviedo (ES); Fernando Nuño Garcia, Oviedo (ES); Miguel Jose Prieto, Oviedo (ES)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/022,892

(22) Filed: Dec. 20, 2001

(65) Prior Publication Data

US 2002/0085395 A1 Jul. 4, 2002

(30) Foreign Application Priority Data

Dec. 21, 2000 (ES) .......................... P200003071

(51) Int. Cl.⁷ .......................... H02M 3/335; H02M 5/42
(52) U.S. Cl. .............. 363/24; 363/16; 363/78
(58) Field of Search .................. 363/16, 17, 97, 363/95, 78, 24

(56) References Cited

U.S. PATENT DOCUMENTS

| 5,675,484 | A | * | 10/1997 | Shimada | ...................... 363/71 |
|---|---|---|---|---|---|
| 5,754,414 | A | * | 5/1998 | Hanington | ................... 363/98 |
| 5,768,111 | A | * | 6/1998 | Zaitsu | ......................... 363/95 |
| 5,886,514 | A | * | 3/1999 | Iguchi et al. | ................ 323/299 |
| 5,923,542 | A | * | 7/1999 | Sasaki et al. | .................. 363/16 |
| 5,923,546 | A | * | 7/1999 | Shimada et al. | .............. 363/40 |
| 5,969,954 | A | * | 10/1999 | Zaitsu | ......................... 363/16 |

* cited by examiner

*Primary Examiner*—Bao Q. Vu
(74) *Attorney, Agent, or Firm*—Sughrue Mion, PLLC

(57) ABSTRACT

The switched power converter comprises a first rectifier module (11-1) connected to a first capacitor (11-2) that, in turn, is connected to an excitation module (11-3) that applies a voltage to some input terminals (PT-1, PT-2) of a piezoelectric transformer (PT).

A controller device (11-3-3) governs the excitation module (11-3) in order that the piezoelectric transformer (PT) works at constant frequency and regulates the power delivered to the output of the converter by enabling/disabling the voltage applied to the terminals (PT-1, PT-2).

When the piezoelectric transformer (PT) is not transferring energy between its input terminals (PT-1, PT-2) and its output terminals (PT-3, PT-4), the converter output voltage is supplied by a second capacitor included in a second filter (11-6).

6 Claims, 3 Drawing Sheets

Stopped

SWITCHED POWER CONVERTER UTILIZING A PIEZOELECTRIC TRANSFORMER

OBJECT OF THE INVENTION

The present invention relates to a switched power converter that comprises a piezoelectric transformer that works at constant frequency and regulates the power supplied at the output of the converter by means of disabling/enabling of the voltage applied to the input of the piezoelectric transformer.

STATE OF THE ART

One of the most significant characteristics of the piezoelectric devices is their noticeable frequency dependence; this fact is clearly illustrated by quartz oscillators, which are based on the piezoelectric effect in order to obtain determined frequencies, depending on various constructional parameters.

Within this context, transformers of the piezoelectric type do not constitute an exception and have a very marked impedance/frequency characteristic.

According to an equivalent circuit valid between the resonant and anti-resonant frequencies, the separation between the two frequencies is very reduced, of the order of a few tens of kilohertz.

This type of transformer finds employment in different DC/DC converter topologies, because the increase in power density and performance that are achieved are greater than those obtained with magnetic materials.

The power topologies based on incorporating transformers of the piezoelectric type try to include the parasitic elements in the actual topology, with the objective of minimising the number of components to be employed and that these elements distort the operation thereof to the least possible extent.

In this type of transformer there is a frequency that can be considered optimum from the point of view of the piezoelectric transformer gain, measured as the turns ratio thereof, efficiency, etc. If working at a constant frequency with this type of transformer, maximum advantage is taken of the excellent characteristics thereof.

Operating at constant frequency permits the optimisation of the piezoelectric transformer and of the remaining components of the power topology; on the other hand, it presents the serious drawback of how to regulate the power transferred to the secondary of the piezoelectric transformer.

It is known from the state of the art that the output voltage regulation is achieved by varying the frequency of the voltage applied at the input of the piezoelectric transformer. This type of regulation has some drawbacks, for example it is not possible to optimise the additional magnetic materials that have to be used, given that the working frequency is variable.

The short-circuit situation on the output of the piezoelectric transformer implies a hazardous situation for it, given that the frequency control will have a tendency to vary the frequency of the waveform applied at the input of the piezoelectric transformer, taking it to the maximum value possible; in this case, the input voltage to the piezoelectric transformer is boosted to really dangerous levels, and it is necessary to implement a sufficiently fast protection circuit to prevent the destruction of the piezoelectric transformer due to an overvoltage at the input.

It is necessary to implement protection against an open-circuit or no-load situation in the converter, given that in this situation, energy is being supplied to the piezoelectric transformer and none is being extracted from it; the result of this situation is an overvoltage on the input of the piezoelectric transformer and, just as in the previous case, it is necessary to implement another protection circuit to prevent the piezoelectric transformer under this undesired situation, with the consequent increase in component count.

The foregoing situations become still more complicated if it is taken into account that it is also necessary to detect when they vanish, or, in other words, when the main control has to retake command.

The regulation of a converter that incorporates a piezoelectric transformer is a problem, given that it is a non-linear device which greatly complicates the modelling thereof; the design of a regulation loop is therefore not a simple problem and shall be heavily dependent on the piezoelectric transformer and on the working conditions of the converter.

The narrow working margin of this type of device must again be stressed: the manufacturing spread can result in a converter working perfectly with a determined piezoelectric transformer whilst this same converter does not work correctly with another piezoelectric transformer from the same production batch (or the reverse situation), due to the spread in characteristics; in other words, the manufacturing spread in these converters should be practically nil.

All these inconveniences found in frequency control can be avoided if the control is carried out at a fixed frequency.

CHARACTERISATION OF THE INVENTION

The switched converter of the invention includes, connected in cascade, a first rectifier module connected to a first capacitor that, in turn, is connected to an excitation module in order to produce a waveform that is applied across some input terminals of a piezoelectric transformer.

The piezoelectric transformer transforms the voltage waveform received into another voltage, which is rectified by a rectifier module and smoothed in a filter. The smoothed voltage corresponds to the output voltage of the switched converter.

A controller device governs the switching of the excitation module in order that the piezoelectric transformer works at constant frequency and regulates the power delivered to the output of the converter by means of disabling/enabling of the waveform applied across the input terminals of the piezoelectric transformer. When the piezoelectric transformer is not transferring energy from its input terminals to its output terminals, the output voltage of the converter is supplied by a second capacitor included in the output filter.

Thus, the input waveform to the piezoelectric transformer is modulated with a modulating waveform at low frequency; this modulating waveform is obtained by comparing the output voltage of the switched converter with a reference voltage to be reached.

The modulating waveform at low frequency is determined on the basis of the working conditions of the converter and of the output filter.

BRIEF DESCRIPTION OF THE DRAWINGS

A more detailed explanation of the invention is given in the following description, based on the figures attached, in which.

DESCRIPTION OF THE INVENTION

In making the detailed description of an embodiment of the present invention, reference shall be made to the figures of the attached drawings, with the aim of facilitating the understanding of said description.

Figure 1:
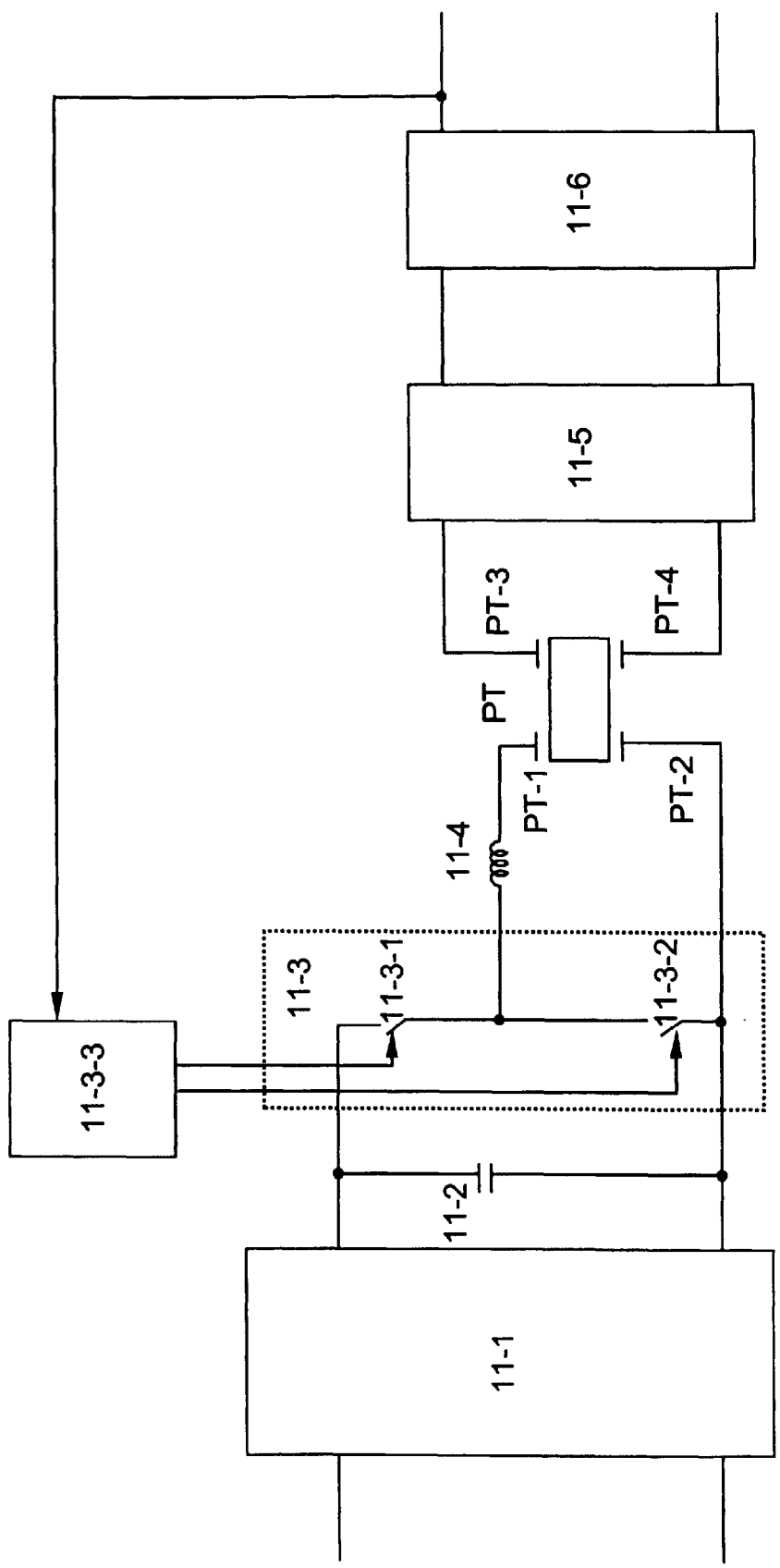
FIG. 1 shows, in a block diagram, an embodiment of a switched power converter according to the invention.

FIG. 1 shows the switched power converter of the invention, which receives a first input voltage from a voltage source, for example an alternating current AC distribution mains.

The switched power converter comprises, in a connection in cascade, a first rectifier 11-1 such as a full-wave diode bridge, which receives across its input terminals the first input voltage, and produces a voltage across its output terminals that is applied to a first capacitor 11-2, which smoothes the voltage received from the first rectifier 11-1.

A excitation block 11-3 is connected in parallel with the first capacitor 11-2, said block comprising a conversion topology such as one of the half-bridge type, for example, it being possible to employ other conversion topologies that offer galvanic isolation.

The excitation block 11-3 comprises a series combination of a first switching element 11-3-1 and a second switching element 11-3-2. The excitation block 11-3 generates a square-wave voltage having a peak value equal to the first input voltage, which is applied to a first choke 11-4 and piezoelectric transformer PT assembly.

Figure 2:
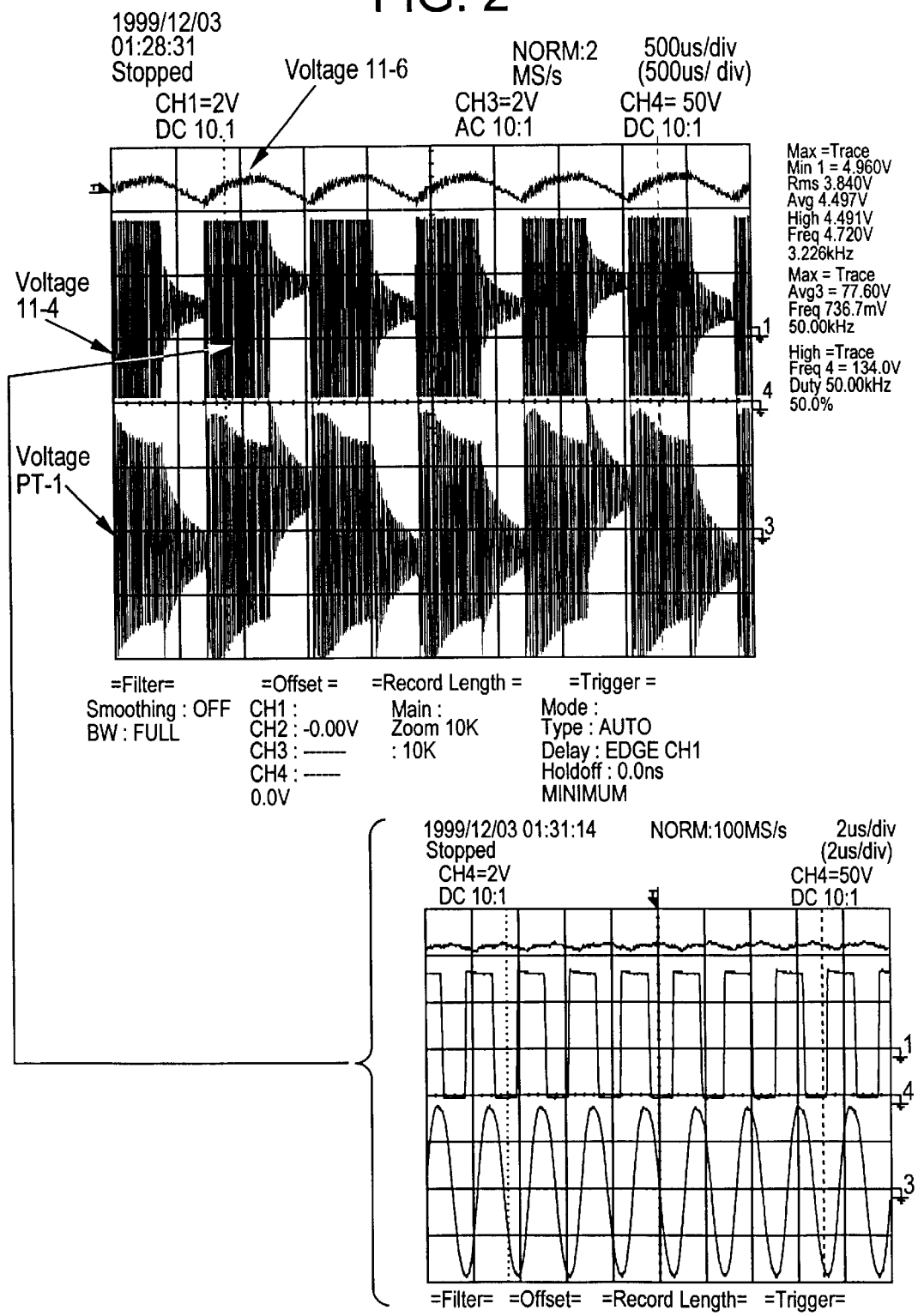
FIG. 2 shows the most significant waveforms of the switched power converter according to the invention.

The first choke 11-4 together with an input parasitic capacitance of the piezoelectric transformer PT constitutes a filter, whereby the input voltage to the piezoelectric transformer PT is practically a pure sinusoid (see FIG. 2).

In FIG. 2, it is possible to see the voltage signal on the first choke 11-4 and on the input terminal PT-1 of the piezoelectric transformer PT, and the output voltage of the converter delivered to the load, which corresponds with the output voltage of the filter 11-6. It is possible to see also a detail of the voltage on the input terminal PT-1.

Returning to FIG. 1, some output terminals PT-3 and PT-4 of the piezoelectric transformer PT are connected to a second rectifier 11-5, which produces a rectified voltage across its output terminals that is applied to a second filter 11-6 with the objective of smoothing the rectified voltage before being applied to a load. The output voltage of the second filter 11-6 corresponds to the output voltage of the switched power converter.

It is possible for both the first switching element 11-3-1 and the second switching element 11-3-2 to be field effect transistors MOSFET, respectively. Likewise, it is possible for example for the second rectifier 11-5 to be a self-driven synchronous rectifier. The second filter 11-6 includes at least a second capacitor.

The operation of the half-bridge type topology is known from the state of the art; consequently it is not explained here in detail. Briefly, its operation is summarised in that when, for example, the first MOSFET 11-3-1 is conducting (ON) there is a first voltage level applied across some input terminals PT-1 and PT-2 of the piezoelectric transformer PT; the second MOSFET 11-3-2 being not conducting or cut off (OFF).

After a time (duty cycle) set by a controller device 11-3-3, the first MOSFET 11-3-1 switches to cut-off (OFF). After a time (duty cycle), set by the controller device 11-3-3, the second MOSFET 11-3-2 comes into conduction (ON) and there is a second voltage level applied across the input terminals is PT-1 and PT-2 of the piezoelectric transformer PT.

The controller device 11-3-3 governs the transfer of energy carried out by the piezoelectric transformer PT between its input terminals PT-1, PT-2 and its output terminals PT-3, PT-4, with the object that the piezoelectric transformer PT works at constant frequency.

Likewise, the controller device 11-3-3 regulates the power delivered to the load by disabling/enabling the voltage applied across the input terminals PT-1 and PT-2 of the piezoelectric transformer PT; in other words, modulating the input waveform to the piezoelectric transformer PT with a modulating waveform at low frequency, determined by the working conditions of the converter and the output filter 11-6 (input voltage to the converter, current fed to the load).

This manner of working does not affect the piezoelectric transformer PT since a waveform consisting of two at distinct frequencies is applied to it, but the frequency of the modulating waveform is noticeably lower than the working frequency of the piezoelectric transformer PT.

This modulating waveform is obtained by means of comparing the output voltage with a reference output voltage to be reached by the converter, in such a manner that if the output voltage is greater than the reference voltage, the input voltage to the PT is taken to zero and if the opposite is the case, that is the output voltage is less than the reference voltage, the fixed, sinusoidal voltage at constant frequency is applied until the previous situation is reached.

During the time in which the input voltage to the piezoelectric transformer PT is disabled, the second capacitor included in the filter 11-6 supplies the output voltage of the switched power converter. Therefore, there are periods of time, of variable duration, during which the piezoelectric transformer PT does not transfer energy from its input terminals PT-1, PT-2 to the output terminals PT-3, PT-4.

The controller device 11-3-3 is completed by providing it with a degree of hysteresis, with the aim of improving the response of the switched power converter.

Furthermore, the controller device 11-3-3 directs the complete discharge of the input capacitance of the piezoelectric transformer PT prior to the start of each duty cycle, with the aim of assuring that no dangerous overvoltages appear at the input thereof.

Figure 3:
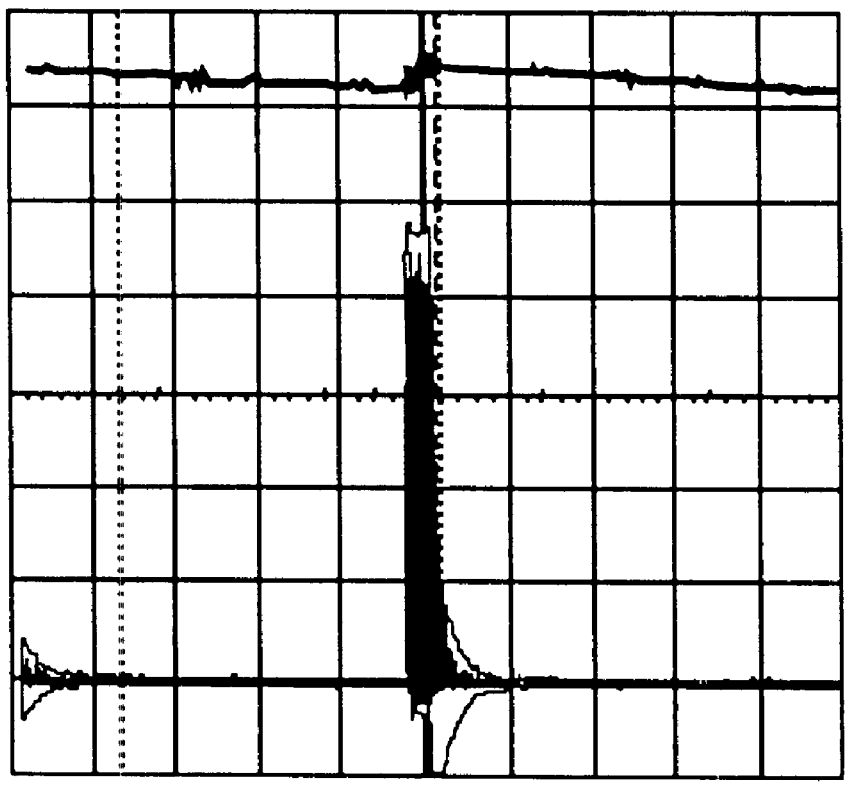
FIG. 3 shows the waveform of the switched power converter according to the invention in low load operating conditions.

At the start of each duty cycle a high voltage surge is produced because of the residual charge that is present on the input capacitance of the piezoelectric transformer PT. This high voltage surge on the input of the piezoelectric transformer PT is suppressed if the disabling of the converter is carried out solely and exclusively by inhibiting the control pulses of the first MOSFET 11-3-1 and those of the second MOSFET 11-3-2 are preserved, in such a manner that the input capacitance of the piezoelectric transformer PT is completely discharged at the start of the duty cycle. For example, under low load operating conditions, it can be observed in FIG. 3 how the transfer of energy takes place in a much shorter time.

This mode of operating does not affect the piezoelectric transformer PT, since a waveform consisting of two at distinct frequencies is applied to the piezoelectric transformer PT, but the frequency of the modulating waveform is noticeably less than the working frequency of the piezoelectric transformer PT and the latter is unaffected. The converter changes from under-load to no-load and vice versa without any overvoltage whatsoever at any time.

The operating mode of the switched power converter permits to overcome the problems that appear in the state of the art when working at variable frequency with a piezoelectric transformer PT, whilst at the same time the use of the same is optimised by working at constant frequency.

The working frequency is selected in order that the piezoelectric transformer PT behaves optimally and also that it has a value that makes the converter satisfy certain basic requirements, such as achieving zero voltage switching (ZVS) throughout the working range, load regulation, or others; in any case, it combines the advantages of working at constant frequency, as is the optimisation of the additional magnetic elements that have to be included in the converter: for example, it permits the optimisation of the choke of the input filter.

The piezoelectric transformer PT is protected in an inherent way against short-circuits and no-load situations because of working at fixed frequency in one case and to the immediate control loop response in the no-load case. It should be pointed out that it is not necessary to include additional components for protection against these undesirable situations, nor circuitry for recovering the main control loop.

By way of example, the controller device 11-3-3 is extremely simple, it includes a comparator with hysteresis, the range of which has to be equal to the ripple of the output voltage that is permitted for the switched power converter. In this sense, it must be said that the switched converter permits somewhat more flexibility when allowing for manufacturing spreads.

What is claimed is:

1. Switched power converter comprising:
    a piezoelectric transformer having a plurality of output terminals related to at least one output of the switched power converter, and a plurality of input terminals coupled to an output of an excitation module through a first choke coupled to a first capacitor, wherein said first capacitor is coupled to a power supply through a first rectifier module; and
    a controller device adapted for disabling/enabling a voltage applied across the input terminals of the piezoelectric transformer, based on a predetermined desired level of an output voltage, wherein said applied voltage is enabled at a constant frequency when said output voltage does not exceed said predetermined desired level and said applied voltage is disabled when said output voltage exceeds said predetermined desired level.

2. Switched power converter according to claim 1, wherein the piezoelectric transformer is adapted for working at said constant frequency during a period of time in which the voltage applied across the input terminals is enabled.

3. Switched power converter according to claim 1, wherein the piezoelectric transformer is adapted for not transferring energy from its input terminals to its output terminals during a period of time in which the voltage applied across the input terminals is disabled.

4. Switched power converter according to claim 2, wherein a second capacitor is adapted for being charged during the period of time in which the voltage applied across the input terminals is enabled.

5. Switched power converter according to claim 3, wherein the second capacitor is adapted for supplying the output voltage of the switched power converter during the time in which the voltage applied across the input terminals is disabled.

6. Switched power converter according to claim 1, wherein the switched power converter includes a second filter that includes a second capacitor.

* * * * *

UNITED STATES PATENT AND TRADEMARK OFFICE
CERTIFICATE OF CORRECTION

PATENT NO.    : 6,504,734 B2
DATED         : January 7, 2003
INVENTOR(S)   : Jose Andres Navas Sabater et al.

It is certified that error appears in the above-identified patent and that said Letters Patent is hereby corrected as shown below:

<u>Title page,</u>
Item [75], please correct the name of the third inventor as follows:
Delete "(ES); Juan Diez Gonzalez, Oviedo" and correct to -- (ES); Juan Diaz Gonzalez, Oviedo --

Signed and Sealed this

Eighth Day of April, 2003

JAMES E. ROGAN
*Director of the United States Patent and Trademark Office*